United States Patent
Moon et al.

(10) Patent No.: US 9,653,145 B1
(45) Date of Patent: May 16, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Hong Ki Moon, Seoul (KR); Jeong Tae Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/218,544

(22) Filed: Jul. 25, 2016

(30) Foreign Application Priority Data

Mar. 17, 2016 (KR) .................. 10-2016-0032407

(51) Int. Cl.
  G11C 11/40      (2006.01)
  G01K 13/00      (2006.01)
  G11C 11/406     (2006.01)

(52) U.S. Cl.
  CPC ........ *G11C 11/40626* (2013.01); *G01K 13/00* (2013.01)

(58) Field of Classification Search
  CPC ............ G11C 11/40626; G01K 13/00
  See application file for complete search history.

(56) References Cited

U.S. PATENT DOCUMENTS

| 7,196,956 | B2* | 3/2007 | Shirota | G11C 7/04 365/211 |
| 2014/0244947 | A1* | 8/2014 | Song | G06F 13/161 711/154 |
| 2015/0103609 | A1* | 4/2015 | Song | G11C 11/40615 365/198 |
| 2015/0162069 | A1* | 6/2015 | Matsushima | G11C 7/04 365/227 |
| 2015/0244375 | A1 | 8/2015 | Pelley et al. | |

FOREIGN PATENT DOCUMENTS

KR    1020110023114 A    3/2011

* cited by examiner

*Primary Examiner* — Tri Hoang
(74) *Attorney, Agent, or Firm* — William Park & Associates Ltd.

(57) ABSTRACT

A semiconductor system includes a first semiconductor device and a second semiconductor device. The first semiconductor device outputs first to $(M+1)^{th}$ command/address signals (wherein, "M" denotes a natural number which is equal to or greater than two) and receives a detection signal to detect a normality/abnormality of a temperature sensor. The second semiconductor device enters a test mode in response to the $(M+1)^{th}$ command/address signal and compare first to $N^{th}$ sensing codes (wherein, "N" denotes a natural number which is equal to or greater than two) generated by the temperature sensor with the first to $M^{th}$ command/address signals to generate the detection signal. The second semiconductor device also executes a refresh operation in response to a refresh signal including a plurality of pulses whose cycle time is controlled by the first to $M^{th}$ command/address signals.

20 Claims, 8 Drawing Sheets

| SET TEMPERATURE SECTION | CA<4> | CA<3> | CA<2> | CA<1> |
|---|---|---|---|---|
| OVER 100℃ | L | L | L | H |
| 81℃~100℃ | L | L | H | H |
| 61℃~80℃ | L | H | L | H |
| 51℃~60℃ | L | H | H | H |
| 41℃~50℃ | H | L | L | H |
| 31℃~40℃ | H | H | H | H |
| 21℃~30℃ | H | H | L | H |
| BELOW 20℃ | H | H | H | H |

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2016-0032407, filed on Mar. 17, 2016, which is herein incorporated by reference in its entirety.

BACKGROUND

1. Technical Field

Embodiments of the present disclosure relate to semiconductor devices controlling a refresh cycle time and semiconductor systems including the same.

2. Related Art

Dynamic random access memory (DRAM) devices among semiconductor devices may lose data stored in their memory cells as time elapses even while their power supplies are applied to their memory cells, in contrast to static random access memory (SRAM) devices or flash memory devices. In order to prevent the data stored in the DRAM cells from being lost, the DRAM devices may have an operation for rewriting data from external systems in a certain period, which is called "a refresh operation". Usually, such a refresh operation is carried out, in retention times that are inherent in memory cells of the DRAM devices, by activating word lines at least once or more, and sensing/amplifying data of the memory cells. The retention time is a time that data can be maintained without a refresh operation after being written into a memory cell.

The data retention time of the DRAM cell including a single transistor and a single storage capacitor may be very sensitive to temperature. Thus, it may be necessary to control operation conditions of internal circuit blocks of a semiconductor system according to variation of an internal temperature of a semiconductor device in the semiconductor system. Temperature sensors such as digital temperature sensor regulators (DTSRs), analog temperature sensor regulators (ATSRs) or temperature compensated self-refresh (TCSR) sensors have been widely used to control operation conditions of semiconductor devices such as DRAM devices according to variation of the internal temperature of the semiconductor systems.

SUMMARY

Various embodiments are directed to semiconductor devices controlling a refresh cycle time regardless of an internal temperature and a semiconductor system including the same.

According to an embodiment, a semiconductor device includes a temperature sensor, a register, a refresh control circuit, and an internal circuit. The temperature sensor senses an internal temperature of the semiconductor device to generate first to $N^{th}$ sensing codes (wherein, "N" denotes a natural number which is equal to or greater than two). The register stores first to $M^{th}$ command/address signals (wherein, "M" denotes a natural number which is equal to or greater than two), outputs the stored first to $M^{th}$ command/address signals as first to $N^{th}$ mode addresses, stores a detection signal, and outputs the stored detection signal. The refresh control circuit compares the first to $N^{th}$ mode addresses with the first to $N^{th}$ sensing codes to generate the detection signal in response to a $(M+1)^{th}$ command/address signal, generates first to $(2^N)^{th}$ temperature codes from the first to $N^{th}$ mode addresses, and generates a refresh signal including a plurality of pulses whose cycle time is controlled by the first to $N^{th}$ mode addresses. The internal circuit executes a refresh operation in response to the refresh signal.

According to another embodiment, a semiconductor system includes a first semiconductor device and a second semiconductor device. The first semiconductor device outputs first to $(M+1)^{th}$ command/address signals (wherein, "M" denotes a natural number which is equal to or greater than two) and receives a detection signal to detect a normality/abnormality of a temperature sensor. The second semiconductor device enters a test mode in response to the $(M+1)^{th}$ command/address signal and compares first to $N^{th}$ (wherein, "N" denotes a natural number which is equal to or greater than two) sensing codes generated by the temperature sensor with the first to $M^{th}$ command/address signals to generate the detection signal. The second semiconductor device also executes a refresh operation in response to a refresh signal including a plurality of pulses whose cycle time is controlled by the first to $M^{th}$ command/address signals.

According to another embodiment, a semiconductor system includes a first semiconductor device and a second semiconductor device. The first semiconductor device outputs first to $(M+1)^{th}$ command/address signals (wherein, "M" denotes a natural number which is equal to or greater than two), senses an internal temperature to generate first to $N^{th}$ sensing codes (wherein, "N" denotes a natural number which is equal to or greater than two) including information on the internal temperature, and receives a detection signal to detect a normality/abnormality of a temperature sensor. The second semiconductor device enters a test mode in response to the $(M+1)^{th}$ command/address signal, compares the first to $N^{th}$ sensing codes with the first to $M^{th}$ command/address signals to generate the detection signal, and executes a refresh operation in response to a refresh signal including a plurality of pulses whose cycle time is controlled by the first to $M^{th}$ command/address signals.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
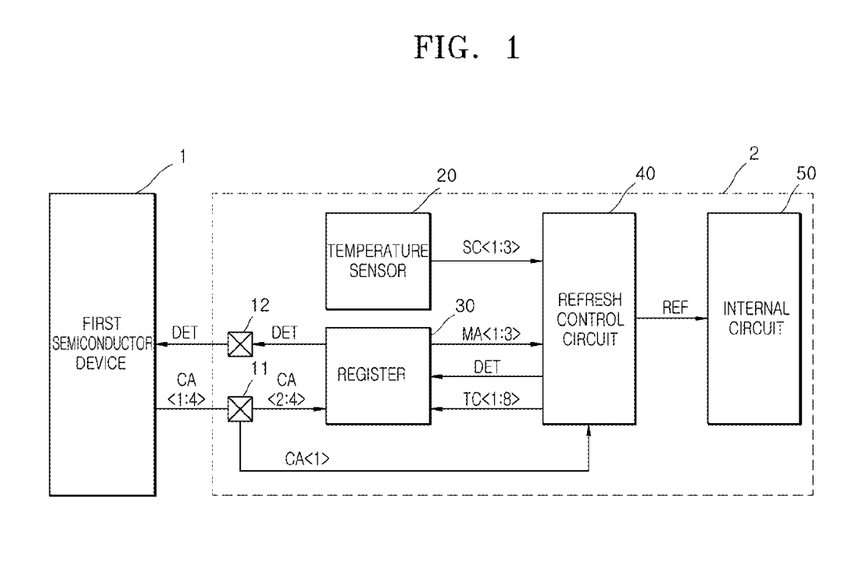
FIG. 1 is a block diagram illustrating a semiconductor system according to an embodiment.

As illustrated in FIG. 1, a semiconductor system according to an embodiment may include a first semiconductor device 1 and a second semiconductor device 2. The second semiconductor device 2 may include a first pad 11, a second pad 12, a temperature sensor 20, a register 30, a refresh control circuit 40, and an internal circuit 50.

The first semiconductor device 1 may output first to fourth command/address signals CA<1:4> and may receive a detection signal DET to detect a normality/abnormality of the temperature sensor 20. The first command/address signal CA<1> may be a signal for putting the second semiconductor device 2 in a test mode which is capable of controlling a refresh cycle time according to information of a set temperature. The second to fourth command/address signals CA<2:4> may be signals for setting sections of the set temperature. In one example, there may be M command address signals CA<2:4>, where M denotes a natural number which is equal or greater than two, and the first command/address signal CA<1> may be represented by the $(M+1)^{th}$ command/address signal. Although the number of bits of the second to fourth command/address signals CA<2:4> is set to be three in the present embodiment, the present disclosure is not limited thereto. For example, in some other embodiments, the number of bits of the command/address signals may be set to be less than or greater than three according to the number of sections of the set temperature.

The temperature sensor 20 may sense an internal temperature of the semiconductor system (e.g., the second semiconductor device 2) to generate first to third sensing codes SC<1:3>. Although in this embodiment, the temperature sensor 20 generates first to third sensing codes SC<1:3>, in other embodiments the temperature sensor 20 may generate "N" sensing codes, where N denotes a natural number which is greater than or equal to two. The first to third sensing codes SC<1:3> may be set to include information on the internal temperature. Although the number of bits of the first to third sensing codes SC<1:3> is set to be three in the present embodiment, the present disclosure is not limited thereto. For example, in some other embodiments, the number of bits of the sensing codes may be set to be less than or greater than three according to the number of sections of the internal temperature. The temperature sensor 20 may be realized using a digital temperature sensor regulator (DTSR), an analog temperature sensor regulator (ATSR), a temperature compensated self-refresh (TCSR) sensor, or the like.

The register 30 may store the second to fourth command/address signals CA<2:4> which are inputted through the first pad 11, and the register 30 may output the stored first to $M^{th}$ or second to fourth command/address signals CA<2:4> as first to $N^{th}$ or first to third mode addresses MA<1:3>. Although, in this example, the register stores the second to fourth command/address signals CA<2:4>, generally the register may store first to $M^{th}$ command/address signals where "M" denotes a natural number which is equal or greater than two. The register 30 may store the detection signal DET and may output the stored detection signal DET to the second pad 12. The register 30 may store first to $2^{Nth}$ or first to eighth temperature codes TC<1:8>. The register 30 may be realized using a mode register set (MRS) including a plurality of registers.

The refresh control circuit 40 may activate the test mode in response to an enabled first command/address signal CA<1> inputted through the first pad 11 and may compare the first to $N^{th}$ or first to third mode addresses MA<1:3> with the first to $N^{th}$ or first to third sensing codes SC<1:3> to generate the detection signal DET. The refresh control circuit 40 may generate the first to $2^{Nth}$ or first to eighth temperature codes TC<1:8> from the first to third mode addresses MA<1:3> in the test mode. The refresh control circuit 40 may generate a refresh signal REF including a plurality of pulses, a generation cycle time of which is controlled by the first to third mode addresses MA<1:3>.

The internal circuit 50 may be realized using a general memory circuit that executes a refresh operation in response to the refresh signal REF.

The second semiconductor device 2 having the aforementioned configuration may enter the test mode in response to the first command/address signal CA<1>, may compare the second to fourth command/address signals CA<2:4> with the first to third sensing codes SC<1:3> (generated by the temperature sensor 20) to generate the detection signal DET, and may execute the refresh operation in response to the refresh signal REF including pluses, a generation cycle time of which is controlled by the second to fourth command/address signals CA<2:4>.

Figure 2:
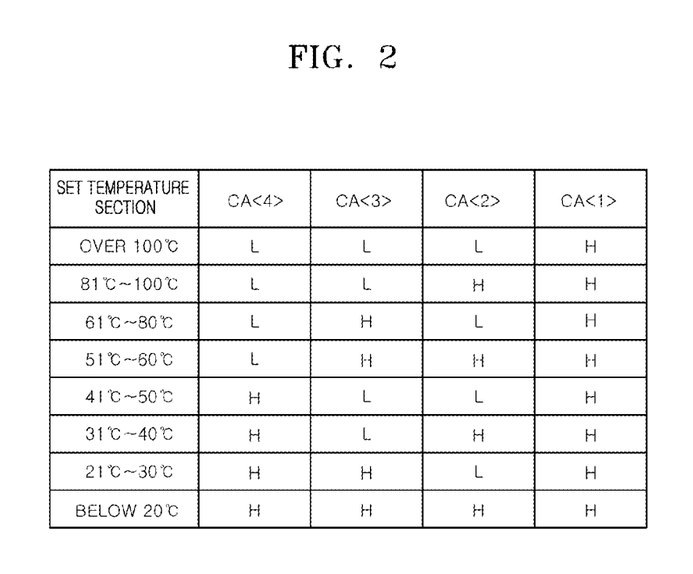
FIG. 2 is a table of set temperature sections applied to the semiconductor system of FIG. 1.

The set temperature section, which may be based on a level combination of the first to fourth command/address signals CA<1:4>, will be described hereinafter with reference to FIG. 2.

First, it may be assumed that the first command/address signal CA<1> is generated to have a logic "high(H)" level in order to put the semiconductor system in the test mode.

If the set temperature is over 100 degrees Celsius, all of the second, third, and fourth command/address signals CA<2:4> may be generated to have a logic "low(L)" level.

If the set temperature is within a range of 81 degrees Celsius to 100 degrees Celsius, the second, third, and fourth command/address signals CA<2:4> may be generated to have a logic "high(H)" level, a logic "low(L)" level, and a logic "low(L)" level, respectively.

If the set temperature is within a range of 61 degrees Celsius to 80 degrees Celsius, the second, third, and fourth command/address signals CA<2:4> may be generated to have a logic "low(L)" level, a logic "high(H)" level, and a logic "low(L)" level, respectively.

If the set temperature is within a range of 51 degrees Celsius to 60 degrees Celsius, the second, third, and fourth command/address signals CA<2:4> may be generated to have a logic "high(H)" level, a logic "high(H)" level, and a logic "low(L)" level, respectively.

If the set temperature is within a range of 41 degrees Celsius to 50 degrees Celsius, the second, third, and fourth command/address signals CA<2:4> may be generated to have a logic "low(L)" level, a logic "low(L)" level, and a logic "high(H)" level, respectively.

If the set temperature is within a range of 31 degrees Celsius to 40 degrees Celsius, the second, third, and fourth command/address signals CA<2:4> may be generated to have a logic "high(H)" level, a logic "low(L)" level, and a logic "high(H)" level, respectively.

If the set temperature is within a range of 21 degrees Celsius to 30 degrees Celsius, the second, third, and fourth command/address signals CA<2:4> may be generated to have a logic "low(L)" level, a logic "high(H)" level, and a logic "high(H)" level, respectively.

If the set temperature is below 20 degrees Celsius, all of the second, third, and fourth command/address signals CA<2:4> may be generated to have a logic "high(H)" level.

The first to third sensing codes SC<1:3> generated by the temperature sensor 20 according to the internal temperature may be set to have the same logic levels as the second, third, and fourth command/address signals CA<2:4>.

Figure 3:
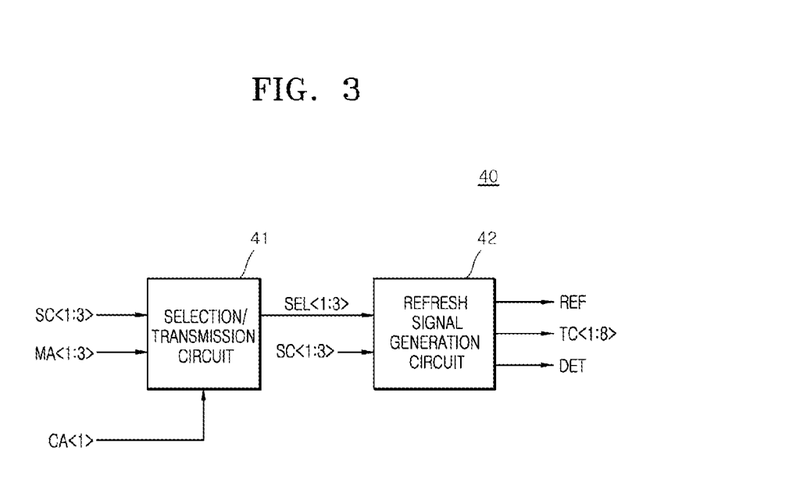
FIG. 3 is a block diagram illustrating a refresh control circuit included in the semiconductor system of FIG. 1.

Referring to FIG. 3, the refresh control circuit 40 may include a selection/transmission circuit 41 and a refresh signal generation circuit 42.

The selection/transmission circuit 41 may output the first to third sensing codes SC<1:3> or the first to third mode addresses MA<1:3> as first to $N^{th}$ or first to third selection codes SEL<1:3> in response to the first command/address signal CA<1>. The selection/transmission circuit 41 may output the first to third sensing codes SC<1:3> as the first to third selection codes SEL<1:3> if the first command/address signal CA<1> is disabled. The selection/transmission circuit 41 may output the first to third mode addresses MA<1:3> as the first to third selection codes SEL<1:3> if the first command/address signal CA<1> is enabled.

The refresh signal generation circuit 42 may generate the refresh signal REF including pluses, a generation cycle time of which is controlled by the first to third selection codes SEL<1:3>. The refresh signal generation circuit 42 may compare the first to third selection codes SEL<1:3> with the first to third sensing codes SC<1:3> to generate the detection signal DET. The refresh signal generation circuit 42 may generate the first to eighth temperature codes TC<1:8> from the first to third selection codes SEL<1:3>.

Figure 4:
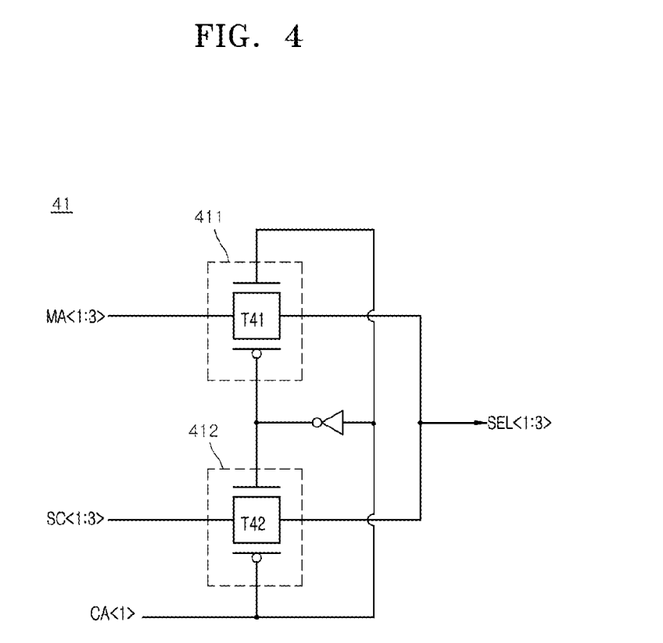
FIG. 4 is a circuit diagram illustrating a selection/transmission circuit included in the refresh control circuit of FIG. 3.

Referring to FIG. 4, the selection/transmission circuit 41 may include a first transfer circuit 411 and a second transfer circuit 412.

The first transfer circuit 411 may be realized using a transfer gate T41. The transfer gate T41 may be turned on to output the first to third mode addresses MA<1:3> as the first to third selection codes SEL<1:3> if the first command/address signal CA<1> is enabled to have a logic "high" level.

The second transfer circuit 412 may be realized using a transfer gate T42. The transfer gate T42 may be turned on to output the first to third sensing codes SC<1:3> as the first to third selection codes SEL<1:3> if the first command/address signal CA<1> is disabled to have a logic "low" level.

Figure 5:
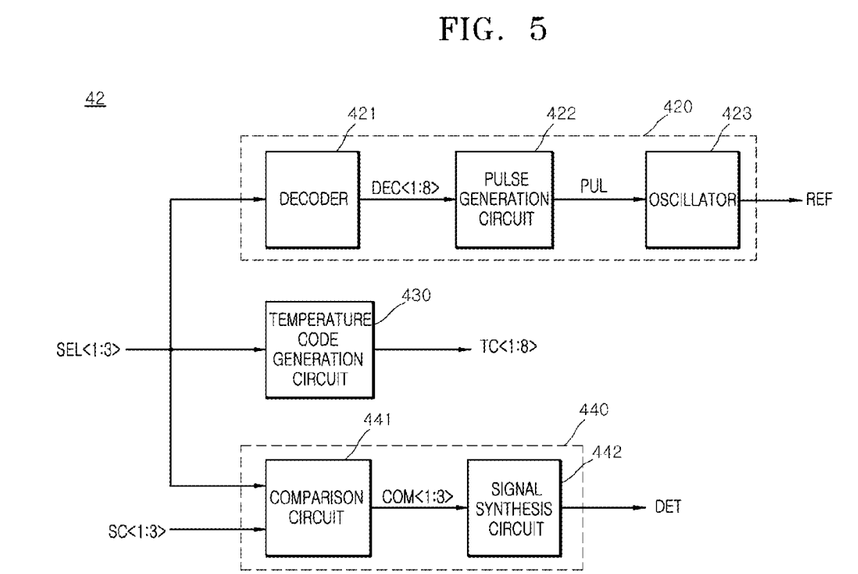
FIG. 5 is a block diagram illustrating a refresh signal generation circuit included in the refresh control circuit of FIG. 3.

Referring to FIG. 5, the refresh signal generation circuit 42 may include a cycle time control circuit 420, a temperature code generation circuit 430, and a code comparison circuit 440.

The cycle time control circuit 420 may include a decoder 421, a pulse generation circuit 422, and an oscillator 423.

The decoder 421 may decode the first to third selection codes SEL<1:3> to generate first to eighth decoded signals DEC<1:8>, one of which is selectively enabled. The decoder 421 may be realized using a general decoder that decodes "N"—number of signals to generate "$2^N$"—number of signals (wherein, "N" denotes a natural number which is equal to or greater than two), one of which is selectively enabled.

The pulse generation circuit 422 may generate a pulse signal PUL, a width of which is controlled in response to the first to eighth decoded signals DEC<1:8>. For example, the pulse generation circuit 422 may generate the pulse signal PUL having a reference pulse width if the first decoded signal DEC<1> is enabled, and the pulse generation circuit 422 may generate the pulse signal PUL having a pulse width which is greater than the reference pulse width if the second decoded signal DEC<2> is enabled. That is, if the $N^{th}$ decoded signal DEC<N> is enabled, the pulse generation circuit 422 may generate the pulse signal PUL having a pulse width which is greater than a pulse width of the pulse signal PUL generated when the $(N-1)^{th}$ decoded signal DEC<N> is enabled. The reference pulse width may correspond to a minimum pulse width among the pulse widths of the pulse signals PUL generated in response to the first to eighth decoded signals DEC<1:8>. In some embodiments, the pulse generation circuit 422 may be realized to include a plurality of pulse generation circuits. In such a case, the pulse generation circuit 422 may generate first to eighth pulse signals PULS<1:8>, one of which is selectively enabled in response to the first to eighth decoded signals DEC<1:8>.

The oscillator 423 may generate the refresh signal REF including a plurality of pulses, generation times which are controlled by the pulse width of the pulse signal PUL. The oscillator 423 may be realized using a general ring oscillator. In some embodiments, the oscillator 423 may be realized to include a plurality of oscillators. In such a case, the oscillator 423 may generate the refresh signal REF including a plurality of pulses, generation times which are controlled by the first to eighth pulse signals PULS<1:8> which are also controlled by the level combination of the first to third selection codes SEL<1:3> described above.

The temperature code generation circuit 430 may decode the first to third selection codes SEL<1:3> to generate the first to eighth temperature codes TC<1:8>. The temperature code generation circuit 430 may be realized using a general decoder that decodes "N"—number of signals to generate "$2^N$"—number of signals (wherein, "N" denotes a natural number which is equal to or greater than two), one of which is selectively enabled.

The code comparison circuit 440 may include a comparison circuit 441 and a signal synthesis circuit 442.

The comparison circuit 441 may compare the first to third selection codes SEL<1:3> with the first to third sensing codes SC<1:3> to generate first to third comparison signals COM<1:3>. An operation of the comparison circuit 441 will be described more fully with reference to FIG. 6.

The signal synthesis circuit 442 may generate the detection signal DET enabled in response to the first to third comparison signals COM<1:3> which may indicate that the first to third sensing codes SC<1:3> and the first to third selection codes SEL<1:3> have the same level combination. An operation of the signal synthesis circuit 442 generating the detection signal DET will be described more fully with reference to FIG. 6.

Hereinafter, an operation of the code comparison circuit 440 will be described more fully with reference to FIG. 6.

The comparison circuit 441 may include a first comparison element EOR41, a second comparison element EOR42, and a third comparison element EOR43.

The first comparison element EOR41 may compare the first selection code SEL<1> with the first sensing code SC<1> to generate the first comparison signal COM<1>. The first comparison element EOR41 may generate the first comparison signal COM<1> having a logic "low" level if the first selection code SEL<1> and the first sensing code SC<1> have the same logic level. The first comparison element EOR41 may generate the first comparison signal COM<1> having a logic "high" level if a logic level of the first selection code SEL<1> is different from a logic level of the first sensing code SC<1>. The first comparison element EOR41 may be realized using an exclusive OR gate.

The second comparison element EOR42 may compare the second selection code SEL<2> with the second sensing code SC<2> to generate the second comparison signal COM<2>. The second comparison element EOR42 may generate the second comparison signal COM<2> having a logic "low" level if the second selection code SEL<2> and the second sensing code SC<2> have the same logic level. The second comparison element EOR42 may generate the second comparison signal COM<2> having a logic "high" level if a logic level of the second selection code SEL<2> is different from a logic level of the second sensing code SC<2>. The second comparison element EOR42 may be realized using an exclusive OR gate.

The third comparison element EOR43 may compare the third selection code SEL<3> with the third sensing code SC<3> to generate the third comparison signal COM<3>. The third comparison element EOR43 may generate the third comparison signal COM<3> having a logic "low" level if the third selection code SEL<3> and the third sensing code SC<3> have the same logic level. The third comparison element EOR43 may generate the third comparison signal COM<3> having a logic "high" level if a logic level of the third selection code SEL<3> is different from a logic level of the third sensing code SC<3>. The third comparison element EOR43 may be realized using an exclusive OR gate.

Figure 6:
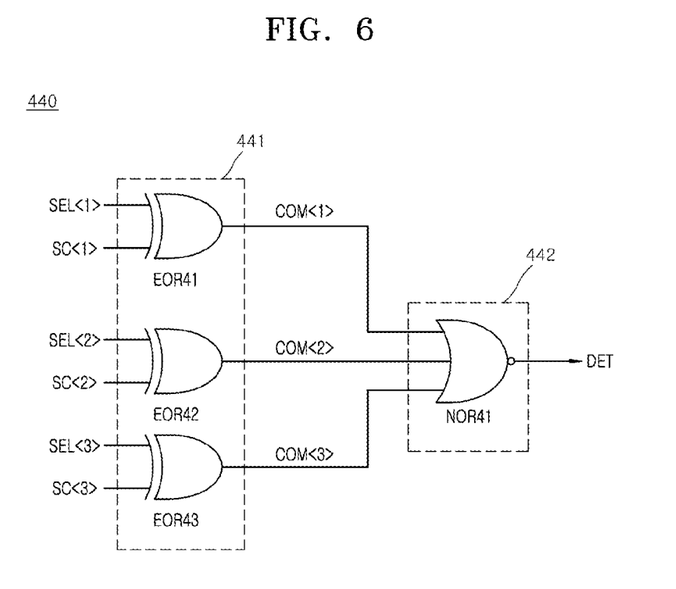
FIG. 6 is a circuit diagram illustrating a code comparison circuit included in the refresh signal generation circuit of FIG. 5.

Although FIG. 6 illustrates an example in which the first to third comparison elements EOR41, EOR42, and EOR43 are realized using exclusive OR gates, the present disclosure is not limited thereto. For example, in some embodiments, the comparison circuit 441 may be realized using any one of various circuits that compare the first to third selection codes SEL<1:3> with the first to third sensing codes SC<1:3> to generate the first to third comparison signals COM<1:3>.

The signal synthesis circuit 442 may be realized using a NOR gate NOR41. Accordingly, the signal synthesis circuit 442 may generate the detection signal DET which is enabled to a logic "high" level if all bits of the first to third comparison signals COM<1:3> have a logic "low" level. The signal synthesis circuit 442 may generate the detection signal DET which is disabled to a logic "low" level if at least one of bits of the first to third comparison signals COM<1:3> have a logic "high" level.

Now, an operation of the semiconductor system illustrated in FIGS. 1 to 6 will be described hereinafter in conjunction with a case that the temperature sensor 20 functions normally and a case that the temperature sensor 20 malfunctions. In either case, it may be assumed that thesemiconductor system operates in the test mode and the set temperature is within the range of 51 degrees Celsius to 60 degrees Celsius.

First, operation of the semiconductor system will be described hereinafter in conjunction with the case that the temperature sensor 20 functions normally.

The first semiconductor device 1 may output the first command/address signal CA<1> having a logic "high" level, the second command/address signal CA<2> having a logic "high" level, the third command/address signal CA<3> having a logic "high" level, and the fourth command/address signal CA<4> having a logic "low" level.

The temperature sensor 20 may sense the internal temperature of the second semiconductor device 2 to output the first sensing code SC<1> having a logic "high" level, the second sensing code SC<2> having a logic "high" level, and the third sensing code SC<3> having a logic "low" level.

The register 30 may store the second to fourth command/address signals CA<2:4> inputted through the first pad 11, and the register 30 may output the second to fourth command/address signals CA<2:4> as the first to third mode addresses MA<1:3>.

The refresh control circuit 40 may generate the refresh signal REF, a cycle time of which is controlled by the first to third mode addresses MA<1:3>, in response to the first command/address signal CA<1> having a logic "high" level. The refresh control circuit 40 may generate the detection signal DET having a logic "high" level because the first to third mode addresses MA<1:3> and the first to third sensing codes SC<1:3> have the same logic level combination. The refresh control circuit 40 may generate the first to eighth temperature codes TC<1:8> from the first to third mode addresses MA<1:3>.

The internal circuit 50 may execute the refresh operation on a predetermined cycle time controlled in response to the refresh signal REF.

The register 30 may store the detection signal DET having a logic "high" level and may output the stored detection signal DET to the second pad 12. The register 30 may store the first to eighth temperature codes TC<1:8>.

The first semiconductor device 1 may receive the detection signal DET having a logic "high" level to confirm or verify that the temperature sensor 20 functions normally.

Next, operation of the semiconductor system will be described hereinafter in conjunction with the case that the temperature sensor 20 malfunctions. In such a case, it is assumed that the temperature sensor 20 incorrectly senses the internal temperature as being within the range of 61 degrees Celsius to 80 degrees Celsius.

The first semiconductor device 1 may output the first command/address signal CA<1> having a logic "high" level, the second command/address signal CA<2> having a logic "high" level, the third command/address signal CA<3> having a logic "high" level, and the fourth command/address signal CA<4> having a logic "low" level.

The temperature sensor 20 may sense the internal temperature to output the first sensing code SC<1> having a logic "low" level, the second sensing code SC<2> having a logic "high" level, and the third sensing code SC<3> having a logic "low" level.

The register 30 may store the second to fourth command/address signals CA<2:4> inputted through the first pad 11 and may output the second to fourth command/address signals CA<2:4> as the first to third mode addresses MA<1:3>.

The refresh control circuit 40 may generate the refresh signal REF, a cycle time of which is controlled by the first to third mode addresses MA<1:3>, in response to the first command/address signal CA<1> having a logic "high" level. The refresh control circuit 40 may generate the detection signal DET having a logic "low" level because a logic level combination of the first to third mode addresses MA<1:3> is different from a logic level combination of the first to third sensing codes SC<1:3>. The refresh control circuit 40 may generate the first to eighth temperature codes TC<1:8> from the first to third mode addresses MA<1:3>.

The internal circuit 50 may execute the refresh operation on a predetermined cycle time controlled in response to the refresh signal REF.

The register 30 may store the detection signal DET having a logic "low" level and may output the stored detection signal DET to the second pad 12. The register 30 may store the first to eighth temperature codes TC<1:8>.

The first semiconductor device 1 may receive the detection signal DET having a logic "low" level to confirm or verify that the temperature sensor 20 malfunctioned.

As described above, a semiconductor system according to an embodiment may generate a refresh signal including a plurality of pulses, generation times which are controlled by command/address signals regardless of an internal temperature, in a test mode, and a refresh cycle time of the semiconductor system may be controlled by the refresh signal. In addition, the semiconductor system may compare internal temperature information generated by a temperature sensor with set temperature information set by the command/address signals to generate a detection signal, and the semiconductor system may sense a logic level of the detection signal to verify whether the temperature sensor functions normally or malfunctions.

Figure 7:
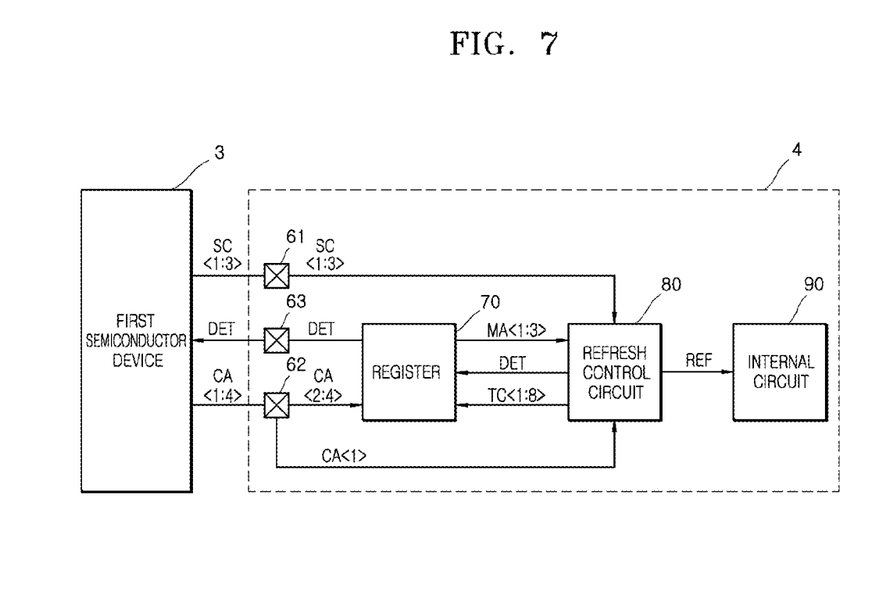
FIG. 7 is a block diagram illustrating a semiconductor system according to another embodiment.

FIG. 7 is a block diagram illustrating a semiconductor system according to another embodiment.

Referring to FIG. 7, the semiconductor system according to another embodiment may include a first semiconductor device 3 and a second semiconductor device 4. The second semiconductor device 4 may include a first pad 61, a second pad 62, a third pad 63, a register 70, a refresh control circuit 80, and an internal circuit 90.

The first semiconductor device 3 may output first to fourth command/address signals CA<1:4> and may receive a detection signal DET to detect a normality/abnormality of a temperature sensor (not shown) included in the semiconductor system. The first command/address signal CA<1> may be a signal for putting the second semiconductor device 4 in a test mode which is capable of controlling a refresh cycle time of a refresh operation according to information on a set temperature. The second to fourth command/address signals CA<2:4> may be signals for setting sections of the set temperature. Although the number of bits of the second to fourth command/address signals CA<2:4> is set to be three in the present embodiment, the present disclosure is not limited thereto. For example, in some other embodiments, the number of bits of the command/address signals may be set to be less than or greater than three according to the number of sections of the set temperature. The first semiconductor device 3 may include the temperature sensor (not shown) that senses an internal temperature of the second semiconductor device 4 to generate first to third sensing codes SC<1:3> which includes information on the internal temperature of the second semiconductor device 4.

The register 70 may store the second to fourth command/address signals CA<2:4> which are inputted through the second pad 62 and may output the stored second to fourth command/address signals CA<2:4> as first to third mode addresses MA<1:3>. The register 70 may store the detection signal DET and may output the stored detection signal DET to the third pad 63. The register 70 may store first to eighth temperature codes TC<1:8>. The register 70 may be realized using a mode register set (MRS) including a plurality of registers.

The refresh control circuit 80 may activate the test mode in response to an enabled first command/address signal CA<1> inputted through the second pad 62, and the refresh control circuit 80 may compare the first to third mode addresses MA<1:3> with the first to third sensing codes SC<1:3> inputted through the first pad 61 to generate the detection signal DET. The refresh control circuit 80 may generate the first to eighth temperature codes TC<1:8> from the first to third mode addresses MA<1:3> in the test mode. The refresh control circuit 80 may generate a refresh signal REF including a plurality of pulses, a generation cycle time of which is controlled by the first to third mode addresses MA<1:3>. The refresh control circuit 80 may have the same configuration as the refresh control circuit 40 illustrated in FIG. 3. Thus, a detailed description of the refresh control circuit 80 will be omitted hereinafter.

The internal circuit 90 may be realized using a general memory circuit that executes a refresh operation in response to the refresh signal REF.

As described above, a semiconductor system according to another embodiment may generate a refresh signal including a plurality of pulses, generation times which are controlled by command/address signals regardless of an internal temperature, in a test mode, and a refresh cycle time of the semiconductor system may be controlled by the refresh signal. In addition, the semiconductor system may compare internal temperature information generated by a temperature sensor with set temperature information set by the command/address signals to generate a detection signal and may sense a logic level of the detection signal to verify whether the temperature sensor functions normally or malfunctions.

Figure 8:
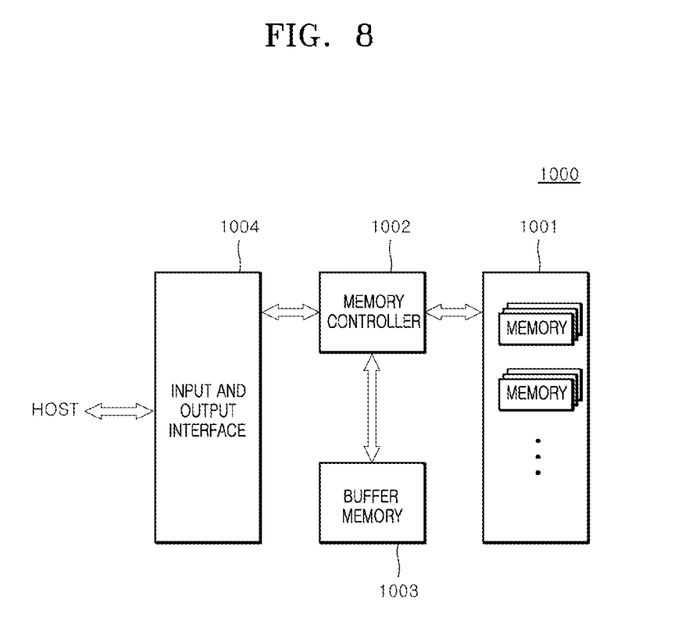
FIG. 8 is a block diagram illustrating a configuration of an electronic system employing at least one of the semiconductor devices or at least one of the semiconductor systems shown in FIGS. 1 to 7.

The second semiconductor devices or the semiconductor systems described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002 according to a control signal generated from the memory controller 1002. The data storage circuit 1001 may include the second semiconductor device 2 illustrated in FIG. 1 or the second semiconductor device 4 illustrated in FIG. 7. Meanwhile, the data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1 or the first semiconductor device 3 illustrated in FIG. 7. Although FIG. 8 illustrates the memory controller 1002 with a single block, the memory controller 1002 may include one controller for controlling the data storage circuit 1001 comprised of a nonvolatile memory, and another controller for controlling the buffer memory 1003 comprised of a volatile memory.

The buffer memory 1003 may temporarily store data which is processed by the memory controller 1002. That is, the buffer memory 1003 may temporarily store data which is outputted from or to be inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM). That is, the buffer memory 1003 may include the second semiconductor device 2 illustrated in FIG. 1 or the second semiconductor device 4 illustrated in FIG. 7.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a temperature sensor configured to sense an internal temperature of the semiconductor device to generate first to $N^{th}$ sensing codes (wherein, "N" denotes a natural number which is equal to or greater than two);
   a register configured to store first to $M^{th}$ command/address signals (wherein, "M" denotes a natural number which is equal to or greater than two), configured to output the stored first to $M^{th}$ command/address signals as first to $N^{th}$ mode addresses, configured to store a detection signal, and configured to output the stored detection signal;
   a refresh control circuit configured to compare the first to $N^{th}$ mode addresses with the first to $N^{th}$ sensing codes to generate the detection signal in response to a $(M+1)^{th}$ command/address signal, configured to generate first to $(2^N)^{th}$ temperature codes from the first to $N^{th}$ mode addresses, and configured to generate a refresh signal including a plurality of pulses whose cycle time is controlled by the first to $N^{th}$ mode addresses; and
   an internal circuit configured to execute a refresh operation in response to the refresh signal.

2. The semiconductor device of claim 1, wherein the $(M+1)^{th}$ command/address signal is enabled to activate a test mode for controlling a cycle time of the refresh operation.

3. The semiconductor device of claim 1, wherein the first to $M^{th}$ command/address signals include information on a set temperature.

4. The semiconductor device of claim 1, wherein the first to $N^{th}$ sensing codes include information on the internal temperature.

5. The semiconductor device of claim 1, wherein the refresh control circuit includes:
   a selection/transmission circuit configured to output the first to $N^{th}$ sensing codes or the first to $N^{th}$ mode addresses as first to $N^{th}$ selection codes in response to the $(M+1)^{th}$ command/address signal; and
   a refresh signal generation circuit configured to generate the refresh signal whose pulse cycle time is controlled by the first to $N^{th}$ selection codes, configured to generate the first to $(2^N)^{th}$ temperature codes according to a level combination of the first to $N^{th}$ selection codes, and configured to compare the first to $N^{th}$ selection codes with the first to $N^{th}$ sensing codes to generate the detection signal.

6. The semiconductor device of claim 5, wherein the refresh signal generation circuit includes:
   a cycle time control circuit configured to generate the refresh signal including the plurality of pulses, generation times which are controlled according to a level combination of the first to $N^{th}$ selection codes;
   a temperature code generation circuit configured to decode the first to $N^{th}$ selection codes to generate the first to $(2^N)^{th}$ temperature codes; and
   a code comparison circuit configured to generate the detection signal which is enabled if the first to $N^{th}$ selection codes and the first to $N^{th}$ sensing codes have the same level combination.

7. The semiconductor device of claim 6, wherein the cycle time control circuit includes:
   a decoder configured to decode the first to $N^{th}$ selection codes to generate first to $(2^N)^{th}$ decoded signals;
   a pulse generation circuit configured to generate a pulse signal, a width of which is controlled in response to the first to $(2^N)^{th}$ decoded signals; and
   an oscillator configured to generate the refresh signal including the plurality of pulses, generation times which are controlled by a pulse width of the pulse signal.

8. The semiconductor device of claim 6, wherein the code comparison circuit includes:
   a comparison circuit configured to compare the first to $N^{th}$ selection codes with the first to $N^{th}$ sensing codes to generate first to $N^{th}$ comparison signals; and
   a signal synthesis circuit configured to generate the detection signal which is enabled in response to the first to $N^{th}$ comparison signals.

9. A semiconductor system comprising:
   a first semiconductor device configured to output first to $(M+1)^{th}$ command/address signals (wherein, "M" denotes a natural number which is equal to or greater than two) and configured to receive a detection signal to detect a normality/abnormality of a temperature sensor; and
   a second semiconductor device configured to enter a test mode in response to the $(M+1)^{th}$ command/address signal, configured to compare first to $N^{th}$ sensing codes (wherein, "N" denotes a natural number which is equal to or greater than two) generated by the temperature sensor with the first to $M^{th}$ command/address signals to generate the detection signal, and configured to execute a refresh operation in response to a refresh signal including a plurality of pulses whose cycle time is controlled by the first to $M^{th}$ command/address signals.

10. The semiconductor system of claim 9, wherein the $(M+1)^{th}$ command/address signal is enabled to activate the test mode for controlling a cycle time of the refresh operation.

11. The semiconductor system of claim 9, wherein the first to $M^{th}$ command/address signals include information on a set temperature.

12. The semiconductor system of claim 9, wherein the first to $N^{th}$ sensing codes include information on an internal temperature.

13. The semiconductor system of claim 9, wherein the second semiconductor device includes:
- a register configured to store the first to $M^{th}$ command/address signals, configured to output the stored first to $M^{th}$ command/address signals as first to $N^{th}$ mode addresses, configured to store the detection signal, and configured to output the stored detection signal;
- a refresh control circuit configured to compare the first to $N^{th}$ mode addresses with the first to $N^{th}$ sensing codes to generate the detection signal in response to the $(M+1)^{th}$ command/address signal, configured to generate first to $(2^N)^{th}$ temperature codes from the first to $N^{th}$ mode addresses, and configured to generate the refresh signal including the plurality of pulses whose cycle time is controlled by the first to $N^{th}$ mode addresses; and
- an internal circuit configured to execute the refresh operation in response to the refresh signal.

14. The semiconductor system of claim 13, wherein the refresh control circuit includes:
- a selection/transmission circuit configured to output the first to $N^{th}$ sensing codes or the first to $N^{th}$ mode addresses as first to $N^{th}$ selection codes in response to the $(M+1)^{th}$ command/address signal; and
- a refresh signal generation circuit configured to generate the refresh signal whose pulse cycle time is controlled by the first to $N^{th}$ selection codes, configured to generate the first to $(2^N)^{th}$ temperature codes according to a level combination of the first to $N^{th}$ selection codes, and configured to compare the first to $N^{th}$ selection codes with the first to $N^{th}$ sensing codes to generate the detection signal.

15. The semiconductor system of claim 14, wherein the selection/transmission circuit includes:
- a first transfer circuit configured to output the first to $N^{th}$ mode addresses as the first to $N^{th}$ selection codes if the $(M+1)^{th}$ command/address signal is enabled; and
- a second transfer circuit configured to output the first to $N^{th}$ sensing codes as the first to $N^{th}$ selection codes if the $(M+1)^{th}$ command/address signal is disabled.

16. The semiconductor system of claim 14, wherein the refresh signal generation circuit includes:
- a cycle time control circuit configured to generate the refresh signal including the plurality of pulses, generation times which are controlled according to a level combination of the first to $N^{th}$ selection codes;
- a temperature code generation circuit configured to decode the first to $N^{th}$ selection codes to generate the first to $(2^N)^{th}$ temperature codes; and
- a code comparison circuit configured to generate the detection signal which is enabled if the first to $N^{th}$ selection codes and the first to $N^{th}$ sensing codes have the same level combination.

17. The semiconductor system of claim 16, wherein the cycle time control circuit includes:
- a decoder configured to decode the first to $N^{th}$ selection codes to generate first to $(2^N)^{th}$ decoded signals;
- a pulse generation circuit configured to generate a pulse signal, a width of which is controlled in response to the first to $(2^N)^{th}$ decoded signals; and
- an oscillator configured to generate the refresh signal including the plurality of pulses, generation times which are controlled by a pulse width of the pulse signal.

18. The semiconductor system of claim 16, wherein the code comparison circuit includes:
- a comparison circuit configured to compare the first to $N^{th}$ selection codes with the first to $N^{th}$ sensing codes to generate first to $N^{th}$ comparison signals; and
- a signal synthesis circuit configured to generate the detection signal which is enabled in response to the first to $N^{th}$ comparison signals.

19. A semiconductor system comprising:
- a first semiconductor device configured to output first to $(M+1)^{th}$ command/address signals (wherein, "M" denotes a natural number which is equal to or greater than two), configured to sense an internal temperature of a second semiconductor device to generate first to $N^{th}$ sensing codes (wherein, "N" denotes a natural number which is equal to or greater than two) including information on the internal temperature of the second semiconductor device, and configured to receive a detection signal to detect a normality/abnormality of a temperature sensor; and
- the second semiconductor device configured to enter a test mode in response to the $(M+1)^{th}$ command/address signal, configured to compare the first to $N^{th}$ sensing codes with the first to $M^{th}$ command/address signals to generate the detection signal, and configured to execute a refresh operation in response to a refresh signal including a plurality of pulses whose cycle time is controlled by the first to $M^{th}$ command/address signals.

20. The semiconductor system of claim 19,
wherein the $(M+1)^{th}$ command/address signal is enabled to activate the test mode for controlling a cycle time of the refresh operation; and
wherein the first to $M^{th}$ command/address signals include information on a set temperature.

* * * * *